United States Patent

Horikawa

(10) Patent No.: US 9,887,387 B2
(45) Date of Patent: Feb. 6, 2018

(54) ORGANIC EL DISPLAY PANEL

(71) Applicant: JOLED INC., Tokyo (JP)

(72) Inventor: Keiji Horikawa, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/473,943

(22) Filed: Mar. 30, 2017

(65) Prior Publication Data

US 2017/0288173 A1 Oct. 5, 2017

(30) Foreign Application Priority Data

Mar. 31, 2016 (JP) ................. 2016-072151

(51) Int. Cl.
| | |
|---|---|
| H01L 23/053 | (2006.01) |
| H01L 21/461 | (2006.01) |
| H01L 51/52 | (2006.01) |
| H01L 27/32 | (2006.01) |
| H01L 51/56 | (2006.01) |

(52) U.S. Cl.
CPC ...... *H01L 51/5256* (2013.01); *H01L 27/3276* (2013.01); *H01L 51/524* (2013.01); *H01L 51/56* (2013.01)

(58) Field of Classification Search
CPC . H01L 51/5253; H01L 51/5256; H01L 51/56; H01L 51/508; H01L 51/524; H01L 21/0217; H01L 21/02458; H01L 23/3192; H01L 23/53295; H01L 27/1248; H01L 27/3244; H01L 29/518
USPC .......................... 257/701, 702, 709; 438/757
See application file for complete search history.

(56) References Cited

U.S. PATENT DOCUMENTS

| | | | |
|---|---|---|---|
| 8,237,361 B2* | 8/2012 | Imai | ............ H01L 51/5256 313/512 |
| 2003/0164677 A1 | 9/2003 | Miyaguchi et al. | |
| 2005/0218803 A1 | 10/2005 | Takeuchi et al. | |
| 2007/0164666 A1 | 7/2007 | Oosono et al. | |
| 2009/0309486 A1 | 12/2009 | Imai et al. | |
| 2012/0052272 A1 | 3/2012 | Iwase | |

FOREIGN PATENT DOCUMENTS

| | | |
|---|---|---|
| JP | 2000-223264 A | 8/2000 |
| JP | 2004-063304 A | 2/2004 |
| JP | 2005-222732 A | 8/2005 |
| JP | 2005-285659 A | 10/2005 |
| JP | 2006-338947 A | 12/2006 |

(Continued)

*Primary Examiner* — Hsien Ming Lee
(74) *Attorney, Agent, or Firm* — Greenblum & Bernstein, P.L.C.

(57) ABSTRACT

An organic EL display panel including: a substrate; display elements over the substrate; a first sealing layer over the display elements; a buffer layer covering the first sealing layer; and a second sealing layer covering the buffer layer. The first sealing layer, the buffer layer, and the second sealing layer are each made of a silicon nitride film, and a peak amount of ammonia gas desorbing from the silicon nitride film of the buffer layer within a predetermined temperature range is greater than one hundred times and smaller than one thousand times a peak amount of ammonia gas desorbing from each of the silicon nitride film of the first sealing layer and the silicon nitride film of the second sealing layer within the predetermined temperature range.

6 Claims, 8 Drawing Sheets

(56) References Cited

FOREIGN PATENT DOCUMENTS

| | | |
|---|---|---|
| JP | 2007-184251 A | 7/2007 |
| JP | 3948365 B2 | 7/2007 |
| JP | 2007-287613 A | 11/2007 |
| JP | 2012-051172 A | 3/2012 |
| JP | 2013-008704 A | 1/2013 |
| JP | 2014-203707 A | 10/2014 |
| JP | 2015-138184 A | 7/2015 |
| WO | 2007/066719 A1 | 6/2007 |

* cited by examiner

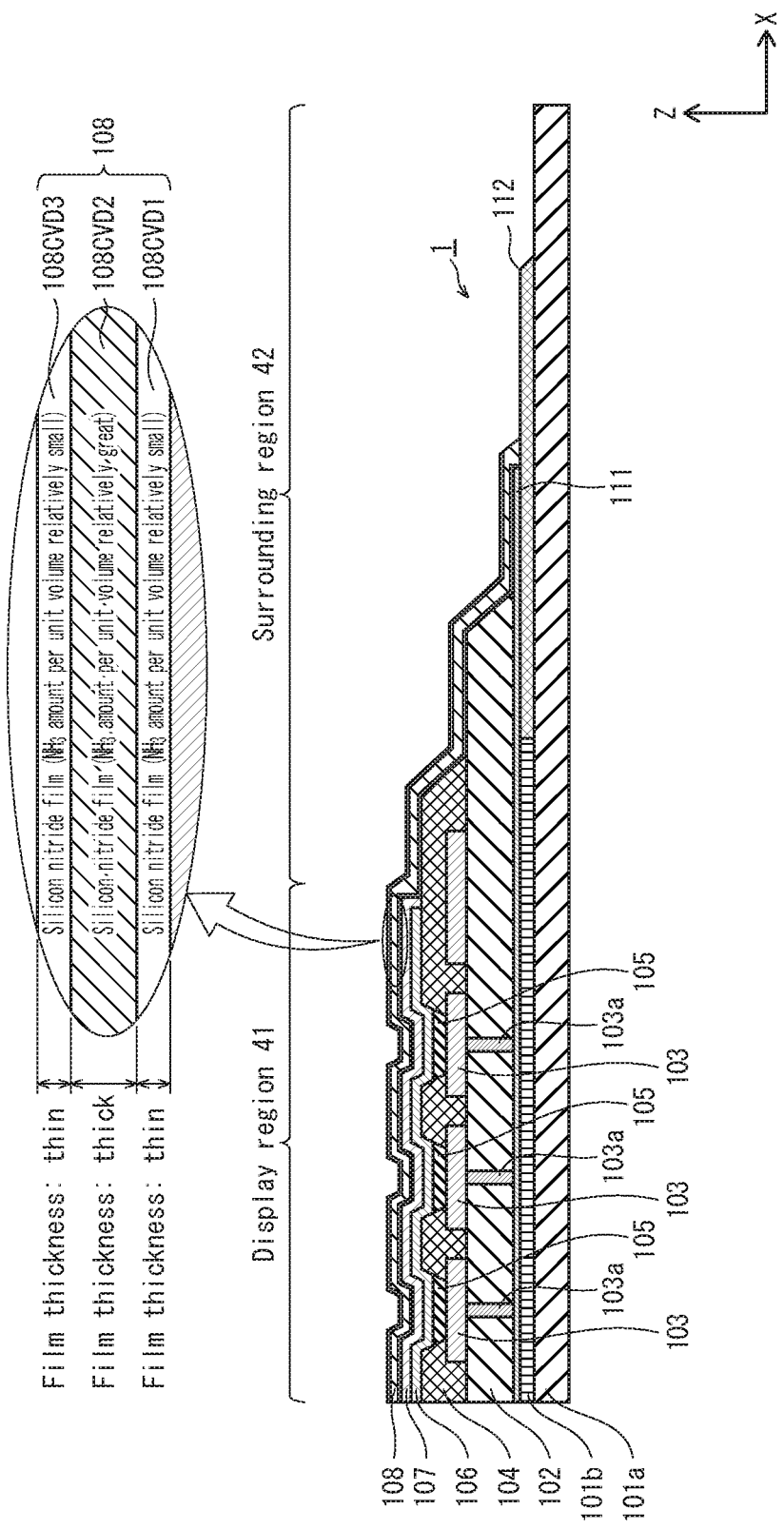

Film-forming conditions in CVD

|  | Silicon nitride film 108CVD1 and silicon nitride film 108CVD3 | Silicon nitride film 108CVD2 |
|---|---|---|
| Pressure | 100 Pa | 2 to 5 times that for 108CVD1/108CVD3 |
| SiH4 gas flow amount | 100 sccm | 2 to 6 times that for 108CVD1/108CVD3 |
| NH3 gas flow amount | 70 sccm | 4 to 20 times that for 108CVD1/108CVD3 |
| N2 gas flow amount | 3000 sccm | Substantially similar to that for 108CVD1/108CVD3 |
| Film thickness | 0.2 μm | 2~10 μm |

| Sample | Time amount of durability in environment where temperature is 85 degrees Celsius and relative humidity is 85% |
|---|---|
| Single-layer structure with only silicon nitride film 108CVD1 | Came apart after 24 hours |
| Triple-layer structure with silicon nitride film 108CVD1, silicon nitride film 108CVD2, and silicon nitride film 108CVD3 | Did not come apart even after 200 hours |

ORGANIC EL DISPLAY PANEL

This application is based on an application No. 2016-072151 filed in Japan, the contents of which are hereby incorporated by reference.

BACKGROUND OF THE DISCLOSURE

(1) Technical Field

The present disclosure is related to organic EL display panels. In particular, the present disclosure is related to an improvement in sealing film durability.

(2) Description of Related Art

A typical organic EL display panel includes a sealing film that protects organic EL display elements arrayed two-dimensionally in the organic EL display panel from moisture, gas, etc. For example, a typical sealing film is formed by using silicon nitride (SiN) and through plasma-enhanced chemical vapor deposition (plasma CVD). In connection with this, a high density silicon nitride film typically has high sealing capability. On the other hand, a high density silicon nitride film typically has extremely low tolerance against bending. Thus, a high density silicon nitride film cannot cover sufficiently a level difference, a foreign particle, or the like present therebelow. (Note that in the following, a capability of a film of covering a level difference, a foreign particle, or the like is referred to as a covering capability of the film.) WO Publication No. 2007/066719 attempts to achieve high sealing capability and high covering capability at the same time with a protective film having a triple-layer structure, or more specifically, a protective film composed of two high density films and a low density film between the two high density films.

SUMMARY OF THE DISCLOSURE

(1) Problem to be Solved

Here, it should be noted that the density of the low density film in WO Publication No. 2007/066719 is not so low, being only slightly lower than the density of the high density films. Thus, it cannot be said that the low density film of WO Publication No. 2007/066719 has deformability high enough to cover level differences, foreign particles, or the like of various shapes.

In view of this, the present disclosure aims to provide an organic EL display panel whose sealing layer has both a covering capability high enough to cover level differences, foreign particle, or the like of various shapes and a sealing capability high enough to sufficiently protect display elements.

(2) Means for Solving Problem

One aspect of the present disclosure is an organic EL display panel including a substrate; display elements over the substrate; a first sealing layer over the display elements; a buffer layer covering the first sealing layer; and a second sealing layer covering the buffer layer, wherein the first sealing layer, the buffer layer, and the second sealing layer are each made of a silicon nitride film, and a peak amount of ammonia gas desorbing from the silicon nitride film of the buffer layer within a predetermined temperature range is greater than one hundred times and smaller than one thousand times a peak amount of ammonia gas desorbing from each of the silicon nitride film of the first sealing layer and the silicon nitride film of the second sealing layer within the predetermined temperature range.

In the organic EL display panel pertaining to one aspect of the present disclosure, the buffer layer, which is between the first and second sealing layers, ensures that any change in shape of the first and second sealing layers in the film-thickness direction is not abrupt and rather is gradual. Thus, the combination of the first and second sealing layers and the buffer layer achieves both a covering capability high enough to cover level differences, foreign particles, or the like of various shapes and a sealing capability high enough to sufficiently protect display elements.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific embodiment of the technology pertaining to the present disclosure.

FIG. 1 is a cross-sectional view illustrating the structure of an organic EL display panel pertaining to an embodiment, taken along an X-Z plane.

DESCRIPTION OF EMBODIMENT(S)

Figure 2A:
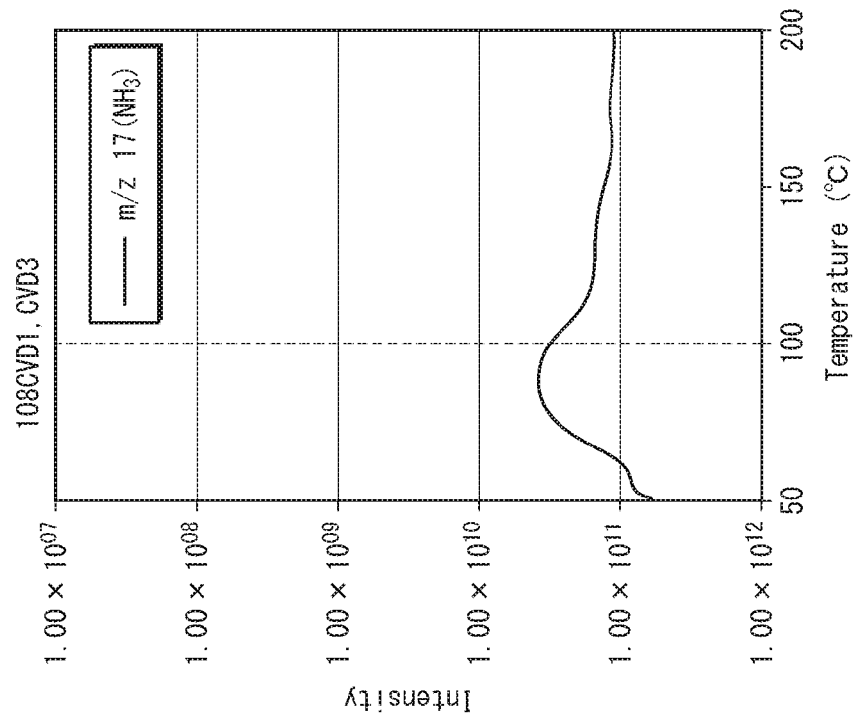
FIG. 2A illustrates one example of results when conducting TDS analysis on a silicon nitride film 108CVD2.

<Process leading to Aspects of Present Disclosure>

Recently, attempts are being made to suppress problems such as the forming of level differences and the introduction of foreign particles in an organic EL display panel manufacturing process. However, it is difficult to completely eliminate level differences, foreign particles, and the like.

Further, depending upon factors such as the shape of a level difference having been formed and the diameter, shape, and position of a foreign particle having been introduced, a large gap may be formed between the level difference, the foreign particle, or the like and a sealing film that is formed over the level difference, the foreign particle, or the like, and a large crack may be formed in the sealing film. Further, the risk of such a crack being formed in a sealing film cannot be eliminated completely with the low density film disclosed in WO Publication No. 2007/066719 for the following reasons.

As already described above, in the protective film disclosed in WO Publication No. 2007/066719, the density of the low-density film is not so low (i.e., the density of the low density film is 93.5% ($\approx 5.8 \times 10^{22}$ [atom/cm$^3$]/$6.2 \times 10^{22}$ [atom/cm$^3$]) that of the high density films, as disclosed in paragraphs [0051] and [0052] of WO Publication No. 2007/066719). Thus, it cannot be said that the deformability of the low density film is high enough.

In addition, a sealing film with a multi-layer structure such as that disclosed in WO Publication No. 2007/066719 poses a peculiar problem. That is, the low density film (silicon film), although having relatively high capability of covering a level difference, cannot completely eliminate the gap between the sealing film and a level difference. Thus, there is still the risk of a crack being formed in the sealing film. Further, the gap between a sealing film and a foreign particle tends to be great and a crack is likely to be formed in the sealing film when the foreign particle is of large size. Also, even when a sealing film is formed over a gently-sloping foreign particle, there is a risk of a large gap being formed between the sealing film and the foreign particle and a crack being formed in the sealing film. The forming of a crack in a sealing film is problematic because when a sealing film with a crack is placed in an environment with high temperature and high humidity, moisture would penetrate through the crack and damage display elements.

Japanese Patent Application Publication No. 2000-223264 and Japanese Patent Application Publication No. 2014-20370 disclose other layer structures for improving the covering capability of sealing films. Specifically, Japanese Patent Application Publication No. 2000-223264 discloses a sealing film that is composed of an inorganic passivation film and a resin sealing film on the inorganic passivation film, and Japanese Patent Application Publication No. 2014-203707 discloses a sealing film composed of a gas sorption agent, an inorganic polymer, etc. disposed between an organic EL display element substrate and a sealing substrate. Here, it should be noted that the sealing films disclosed in Japanese Patent Application Publication No. 2000-223264 and Japanese Patent Application Publication No. 2014-20370 require the use of two or more materials in the forming thereof. Thus, these sealing films are problematic for requiring the use of additional devices, the improvement of material, etc., and thus bringing about an increase in manufacturing and material cost.

In view of this, the inventor carried out a consideration of an organic EL display panel that does not allow the entry of moisture thereinto even when placed under a harsh environment, and that achieves both high sealing performance and high covering performance at low cost. It is through such consideration that the inventor arrived at the organic EL display panel pertaining to one aspect of the present disclosure.

<Aspects of Present Disclosure>

One aspect of the present disclosure is an organic EL display panel including a substrate; display elements over the substrate; a first sealing layer over the display elements; a buffer layer covering the first sealing layer; and a second sealing layer covering the buffer layer, wherein the first sealing layer, the buffer layer, and the second sealing layer are each made of a silicon nitride film, and a peak amount of ammonia gas desorbing from the silicon nitride film of the buffer layer within a predetermined temperature range is greater than one hundred times and smaller than one thousand times a peak amount of ammonia gas desorbing from each of the silicon nitride film of the first sealing layer and the silicon nitride film of the second sealing layer within the predetermined temperature range.

When the first sealing layer, the buffer layer, and the second sealing layer are amorphous silicon nitride films, the Si—N radicals and N—H radicals therein do not form a crystalline structure. In particular, the buffer layer, disposed between the first sealing layer and the second sealing layer, contains a considerably great amount of ammonia not having undergone reaction in the forming thereof. This can be seen from the fact that the peak desorption amount of ammonia gas from the silicon nitride film of the buffer layer is greater than one hundred times and smaller than one thousand times the peak desorption amount of ammonia gas from each of the silicon nitride film of the first sealing layer and the silicon nitride film of the second sealing layer. Due to this, the buffer layer contains a great amount of impurities and has a non-uniform film structure. Meanwhile, the buffer layer has high deformability. Thus, even if the buffer layer is formed over a level difference, a foreign particle, or the like, the change in shape of the buffer layer above the level difference, the foreign particle, or the like is not abrupt and rather gradual. Thus, the buffer layer has a high capability of covering a level difference, a foreign particle, or the like.

Since the change in shape of the buffer layer, when formed over a level difference, a foreign particle, or the like is gradual as described above, the change in shape of the second sealing layer, which covers the buffer layer, over the level difference, the foreign particle, or the like would also be gradual. Thus, the intrusion of moisture, oxygen, and the like into the organic EL display panel can be prevented. Further, the buffer layer covers the first sealing layer. Due to the presence of the first sealing layer, the display elements in the organic EL display panel are not affected by ammonia from the buffer layer. Accordingly, the triple-layer structure composed of the first sealing layer, the buffer layer, and the second sealing layer provides the organic EL display panel with both high sealing performance and high performance of covering a level difference, a foreign particle, or the like.

Further, the peak desorption amount of ammonia gas from the silicon nitride film of the buffer layer is set to smaller than one thousand times the peak desorption amount of ammonia gas from each of the silicon nitride film of the first sealing layer and the silicon nitride film of the second sealing layer. Should the amount of ammonia in the buffer layer be such that the peak desorption amount of ammonia gas from the silicon nitride film of the buffer layer is greater than one thousand times the peak desorption amount of ammonia gas from each of the silicon nitride film of the first sealing layer and the silicon nitride film of the second sealing layer, problems such as the triple-layer structure becoming too weak may occur. The maximum of the peak desorption amount of ammonia gas from the silicon nitride film of the buffer layer has been set to one thousand times the peak desorption amount of ammonia gas from each of the silicon nitride film of the first sealing layer and the silicon nitride film of the second sealing layer in order to avoid such problems.

Further, the peak desorption amount of ammonia gas from the silicon nitride film of the buffer layer is set to greater than one hundred times the peak desorption amount of ammonia gas from each of the silicon nitride film of the first sealing layer and the silicon nitride film of the second sealing layer for the following reason. Specifically, by setting the amount of ammonia in the buffer layer such that the peak desorption amount of ammonia gas from the silicon nitride film of the buffer layer is at least about 100 times the peak desorption amount of ammonia gas from each of the silicon nitride film of the first sealing layer and the silicon nitride film of the second sealing layer, the buffer layer is provided with enough deformability to cover an abrupt level difference, a large foreign particle, or the like.

In the organic EL display panel pertaining to one aspect of the present disclosure, the buffer layer may have a specific thickness as defined in the following. That is, the buffer layer may have a thickness that is at least three times and at most fifty times a thickness of each of the first sealing layer and the second sealing layer, or the thickness of the buffer layer may be at least 2 µm and at most 10 µm.

Providing the buffer layer with such thickness achieves high tolerance of the triple-layer structure against bending.

One aspect of the present disclosure is a method of manufacturing an organic EL display panel, the method including: forming display elements on a substrate; sealing the display elements with a first sealing layer; covering the first sealing layer with a buffer layer; and covering the buffer layer with a second sealing layer, wherein the first sealing layer, the buffer layer, and the second sealing layer are each made of a silicon nitride film, forming of the silicon nitride film of the first sealing layer, the silicon nitride film of the buffer layer, and the silicon nitride film of the second sealing layer is performed through chemical vapor deposition using ammonia gas as a source material, and an ammonia gas flow amount set in forming the silicon nitride film of the buffer layer is greater than four times and smaller than twenty times an ammonia gas flow amount set in forming each of the silicon nitride film of the first sealing layer and the silicon nitride film of the second sealing layer.

In the method pertaining to one aspect of the present disclosure, in the chemical vapor deposition, silane gas may be additionally used as the source material, and a silane gas flow amount set in forming the silicon nitride film of the buffer layer may be greater than twice and smaller than six times a silane gas flow amount set in forming each of the silicon nitride film of the first sealing layer and the silicon nitride film of the second sealing layer.

In the method pertaining to one aspect of the present disclosure, a pressure set in forming the silicon nitride film of the buffer layer for causing ammonia gas, silane gas, and nitrogen gas to react is greater than twice and smaller than five times a pressure set in forming each of the silicon nitride film of the first sealing layer and the silicon nitride film of the second sealing layer for causing ammonia gas, silane gas, and nitrogen gas to react.

According to this method, the forming of the buffer layer is performed after the forming of the first sealing layer and before the forming of the second sealing layer. Thus, the forming of the silicon nitride films of the first sealing layer, the buffer layer, and the second sealing layer can be performed continuously. Further, the ammonia gas flow amount set in forming the silicon nitride film of the buffer layer is greater than four times and smaller than twenty times the ammonia gas flow amount set in forming each of the silicon nitride film of the first sealing layer and the silicon nitride film of the second sealing layer. Accordingly, a triple-layer structure that is composed of the first sealing layer, the buffer layer, and the second sealing layer and thus achieves both high sealing capability and high covering capability can be formed. Thus, high sealing capability and high covering capability can be achieved at the same time, without bringing about any increase in manufacturing and material cost.

Embodiment

[Structure of Organic EL Display Panel]

The following describes an organic EL display panel pertaining to one embodiment of the technology pertaining to the present disclosure, with reference to the accompanying drawings. First, the cross-sectional structure of the organic EL display panel pertaining to the embodiment is described. FIG. 1 is a cross-sectional view illustrating the structure of an organic EL display panel 1, taken along an X-Z plane. Note that the display surface of the organic EL display panel 1 is parallel with an X-Y plane (the Y direction is the direction perpendicular to the drawing sheet).

As illustrated in FIG. 1, the organic EL display panel 1 includes a thin film transistor (TFT) substrate 101, a planarizing layer 102, pixel electrodes 103, banks 104, organic light-emitting layers 105, an electron transport layer 106, a counter electrode 107, a sealing layer 108, a passivation film 111, and a wiring layer 112.

The TFT substrate 101 includes a base substrate 101a and a TFT layer 101b. The base substrate 101a is formed by using an electrically-insulative material such as a glass substrate, a resin substrate, or alumina. The TFT layer 101b is formed by forming a plurality of TFTs in a predetermined pattern on the top surface of the base substrate 101a.

The planarizing film 102 is formed by using an electrically-insulative material such as a polyimide resin or an acrylic resin, and planarizes level differences on the top surface of the TFT layer 101b.

The pixel electrodes 103 are connected to the TFT layer 101b via contact holes 103a. The pixel electrodes 103 are formed by using a material having light reflectivity and electrical conductivity, such as silver (Ag), APC (an alloy of silver, palladium, and copper), ARA (an alloy of silver, rubidium, and gold), MoCr (an alloy of molybdenum and chromium), or NiCr (an alloy of nickel and chromium). The pixel electrodes 103 are disposed at areas corresponding to where sub-pixels of the organic EL display panel 1 are to be formed.

The banks 104 are formed, for example, by using an electrically-insulative organic material such as an acrylic resin, a polyimide resin, or a novolac-type phenolic resin. The banks 104 are disposed over the TFT substrate 101 within a central area of the TFT substrate 101, between the pixel electrodes 103.

The organic light-emitting layers 105 are formed at areas corresponding to where the sub-pixels of the organic EL display panel 1 are to be formed, or in other words, at the areas defined by the banks 104. The organic light-emitting layers 105 are each formed by using an organic light-emitting material that emits either red (R), green (G), or blue (B) light when holes and electrons injected therein, upon driving of the organic EL display panel 1, recombine therein.

The electron transport layer 106 is formed by using, for example, barium, phthalocyanine, or lithium fluoride. The electron transport layer 106 receives electrons injected thereto from the counter electrode 107, and transports the electrons to the organic light-emitting layers 105.

The counter electrode 107 is a light-transmissive electrode formed by using a material having light transmissivity and electrical conductivity, such as indium tin oxide (ITO) or indium zinc oxide (IZO). The counter electrode 107 is formed continuously across the entire display portion of the organic EL display panel 1, on the electron transport layer 106 and over the top surfaces of the banks 104 and the organic light-emitting layers 105. Note that in FIG. 1, a combination of layers having one pixel electrode 103 at the bottom corresponds to one organic EL display element. Specifically, each organic EL display element includes a pixel electrode 103, an organic light-emitting layer 105, a part of the electron transport layer 106 (a part of the electron transport layer that is in contact with the corresponding organic light-emitting layer 105), and a part of the counter electrode 107. Each organic EL display element emits light with one of the colors primary colors R, G, and B, and each pixel emits light that is a combination of light of the colors R, G, and B.

The sealing layer 108 extends over the entirety of the counter electrode 107, and thus, collectively seals the organic EL display elements of the organic EL display panel 1.

The passivation film 111 is a thin film formed by using silicon oxide (SiO) or SiN, and is disposed over the wiring layer 112, which extends out from the TFT layer 101b. For example, the wiring layer 112 is formed by using an electrically conductive material, examples of which include metals such as chromium (Cr), molybdenum (Mo), aluminum (Al), titanium (Ti), and copper (Cu), and metal-containing alloys such as MoW, MoCr, and NiCr. The wiring layer 112 is partially covered by the sealing layer 108.

The organic EL display panel 1 has the structure described up to this point. The following describes the sealing layer 108 in detail.

[Structure of Sealing Layer 108]

The sealing layer 108 has a triple-layer structure, and is a buffer layer composed of a silicon nitride film 108CVD1, a silicon nitride film 108CVD2, and a silicon nitride film 108CVD3. The following explains these silicon nitride films.

The silicon nitride film 108CVD1 covers the top surface of the counter electrode 107. The silicon nitride film 108CVD1 is formed by performing CVD under low pressure with low gas amounts of silane and ammonia, which are the source materials of the silicon nitride film 108CVD1. Due to CVD being performed under such conditions, the Si—N radicals and N—H radicals that are deposited form a uniform silicon nitride film. Thus, the silicon nitride film 108CVD1 has a uniform film structure, and thus has high sealing capability.

The silicon nitride film 108CVD2 covers the top surface of the silicon nitride film 108CVD1, and has higher ammonia content per unit volume than the silicon nitride film 108CVD1. The silicon nitride film 108CVD2 is formed by performing CVD under higher pressure with higher gas amounts of silane and ammonia, which are the source materials of the silicon nitride film 108CVD2, compared to in the CVD for forming the silicon nitride film 108CVD1 and the CVD for forming the silicon nitride film 108CVD3. Due to CVD being performed under such conditions, the silicon nitride film 108CVD2 has a less uniform film structure and contains a greater amount of impurities compared to the silicon nitride film 108CVD1 and the silicon nitride film 108CVD3. Meanwhile, the silicon nitride film 108CVD2 has higher deformability compared to the silicon nitride film 108CVD1 and the silicon nitride film 108CVD3.

The silicon nitride film 108CVD3 covers the top surface of the silicon nitride film 108CVD2, and has ammonia content per unit volume similar to that of the silicon nitride film 108CVD1. Thus, the silicon nitride film 108CVD3 also has a uniform film structure, and thus has high sealing capability.

[Thermal Desorption Spectroscopy Analysis Results]

Figure 2B:
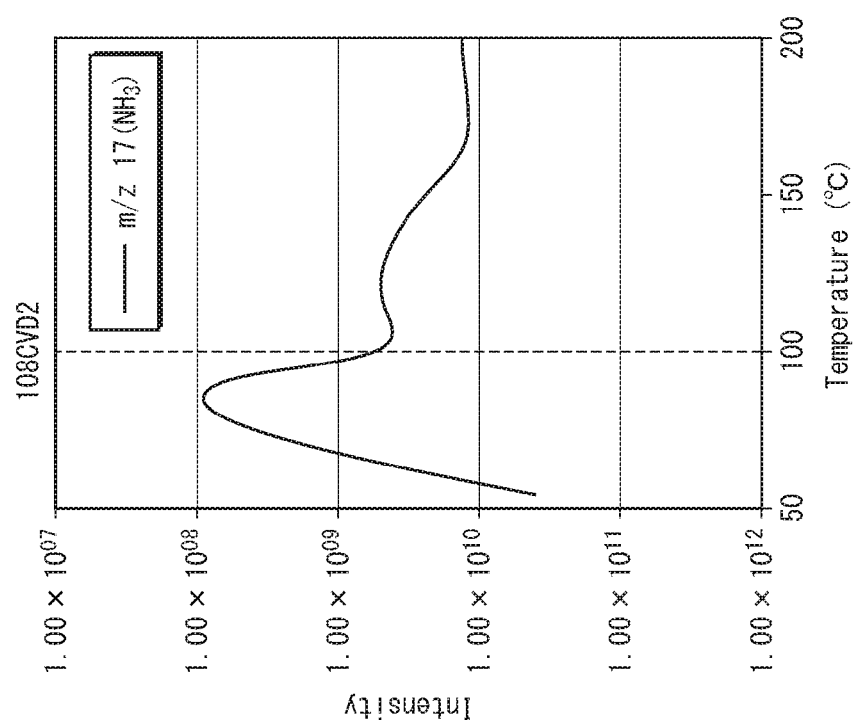
FIG. 2B illustrates one example of results when conducting TDS analysis on a silicon nitride film 108CVD1 (silicon nitride film 108CVD3).

In the following, the ammonia content in the silicon nitride film 108CVD1, the silicon nitride film 108CVD2, and the silicon nitride film 108CVD3 is described. The ammonia content in each of the silicon nitride film 108CVD1, the silicon nitride film 108CVD2, and the silicon nitride film 108CVD3 can be analyzed through thermal desorption spectroscopy (TDS). Typically, TDS is performed by heating a test sample and measuring, for each of multiple types of gas molecules, the amount of molecules desorbing from the surface and the inside of the test sample through the heating. Further, TDS analysis results for a given test sample indicate a change in the amount of desorbed molecules occurring as the temperature of the test sample is changed. FIG. 2A illustrates one example of analysis results when conducting TDS analysis on the silicon nitride film 108CVD2, and FIG. 2B illustrates one example of analysis results when conducting TDS analysis on the silicon nitride film 108CVD1 (silicon nitride film 108CVD3). TDS analysis results can be expressed as a change in curvature of a curve graph where the horizontal axis shows different temperatures and the vertical axis shows detected intensities. The detected intensities are values output from a mass spectrometer, and indicate the amount of gas molecules measured by the mass spectrometer. Specifically, the values within the range from $1.00 \times 10^{-12}$ to $1.00 \times 10^{-7}$ indicating the detected intensities are proportional to the amount of gas molecules detected by the mass spectrometer. Thus, in the following, the amount of molecules desorbing from a test samples is indicated by using the detected intensity output by the mass spectrometer. Further, the curves in FIGS. 2A and 2B indicate how the molecular amount of a molecule specified by mass number (m/z value) 17 changes within the temperature range from 50 degrees Celsius to 200 degrees Celsius. The molecule specified by mass number (m/z value) 17 is ammonia. Thus, the solid line curves in FIGS. 2A and 2B indicate how the desorption amount of ammonia molecules changes within the temperature range from 50 degrees Celsius to 200 degrees Celsius.

[Analysis of Curves Indicating Change in Gas Desorption Amount]

The ammonia content in the silicon nitride film 108CVD2 can be acquired by integrating the ammonia molecule amounts indicated by the curve in FIG. 2A over the entire temperature range, or in other words, by calculating the surface area of the graph region in FIG. 2A surrounded by the solid line curve and the horizontal axis. Similarly, the ammonia content in the silicon nitride film 108CVD1 (silicon nitride film 108CVD3) can be acquired by integrating the ammonia molecule amounts indicated by the curve in FIG. 2B over the entire temperature range, or in other words, by calculating the surface area of the graph region in FIG. 2B surrounded by the solid line curve and the horizontal axis. Further, for each of the silicon nitride film 108CVD1, the silicon nitride film 108CVD2, and the silicon nitride film 108CVD3, ammonia content per unit volume can be calculated by dividing the above-described ammonia content by the volume of the film. As such, the ammonia content in each of the silicon nitride film 108CVD1, the silicon nitride film 108CVD2, and the silicon nitride film 108CVD3 can be estimated from a TDS analysis curve indicating change in ammonia amount.

[Peak Desorption Gas Amount]

The following shows how it is possible to compare the ammonia content in the silicon nitride film 108CVD2 and the ammonia content in the silicon nitride film 108CVD1 (silicon nitride film 108CVD3) by comparing a peak desorption gas amount of the silicon nitride film 108CVD2 and a peak desorption gas amount of the silicon nitride film 108CVD1 (silicon nitride film 108CVD3).

According to FIG. 2A, the desorption amount of ammonia gas (m/z=17) from the silicon nitride film 108CVD2 increases rapidly starting from 50 degrees Celsius, reaches its peak of $1.00 \times 10^{-8}$ around 80 degrees Celsius, and then decreases as the temperature increases from around 80 degrees Celsius to 100 degrees Celsius. Meanwhile, according to FIG. 2B, the desorption amount of ammonia gas (m/z=17) from the silicon nitride film 108CVD1 (silicon nitride film 108CVD3) increases starting from 50 degrees Celsius, reaches its peak around 80 degrees Celsius, and then decreases as the temperature increases from around 80 degrees Celsius to 100 degrees Celsius. In this case, the peak desorption amount is between $1.0 \times 10^{-11}$ and $1.0 \times 10^{-10}$ (is approximately $5.0 \times 10^{-11}$).

From this, it can be seen that the peak desorption amount of ammonia gas (m/z=17) from the silicon nitride film 108CVD2 is greater than one hundred times and smaller than one thousand times the peak desorption amount of ammonia gas (m/z=17) from the silicon nitride film 108CVD1 (silicon nitride film 108CVD3).

[Summary of TDS Analysis Results]

Although there is a slight difference, the shape of the curve indicating ammonia desorption amount from the silicon nitride film 108CVD2 is similar to the shape of the curve indicating the ammonia desorption amount from the silicon nitride film 108CVD1 (silicon nitride film 108CVD3), for starting to rise at 50 degrees Celsius, reaching a peak at 80 degrees Celsius, and then falling as the temperature increases. Based on this similarity in the shapes of the curves and the fact that the peak desorption amount from the silicon nitride film 108CVD2 is greater than one hundred times and smaller than one thousand times that from the silicon nitride film 108CVD1 (silicon nitride film 108CVD3), an assumption can be made that the ammonia content in the silicon nitride film 108CVD2 is much greater than one hundred to one thousand times the ammonia content in the silicon nitride film 108CVD1 (silicon nitride film 108CVD3). Based on this, an assumption can be made that the silicon nitride film 108CVD2 has a less uniform film structure and contains a greater amount of impurities compared to the silicon nitride film 108CVD1 (silicon nitride film 108CVD3).

[Covering Capability and Sealing Capability of Sealing Layer 108]

Figure 3:
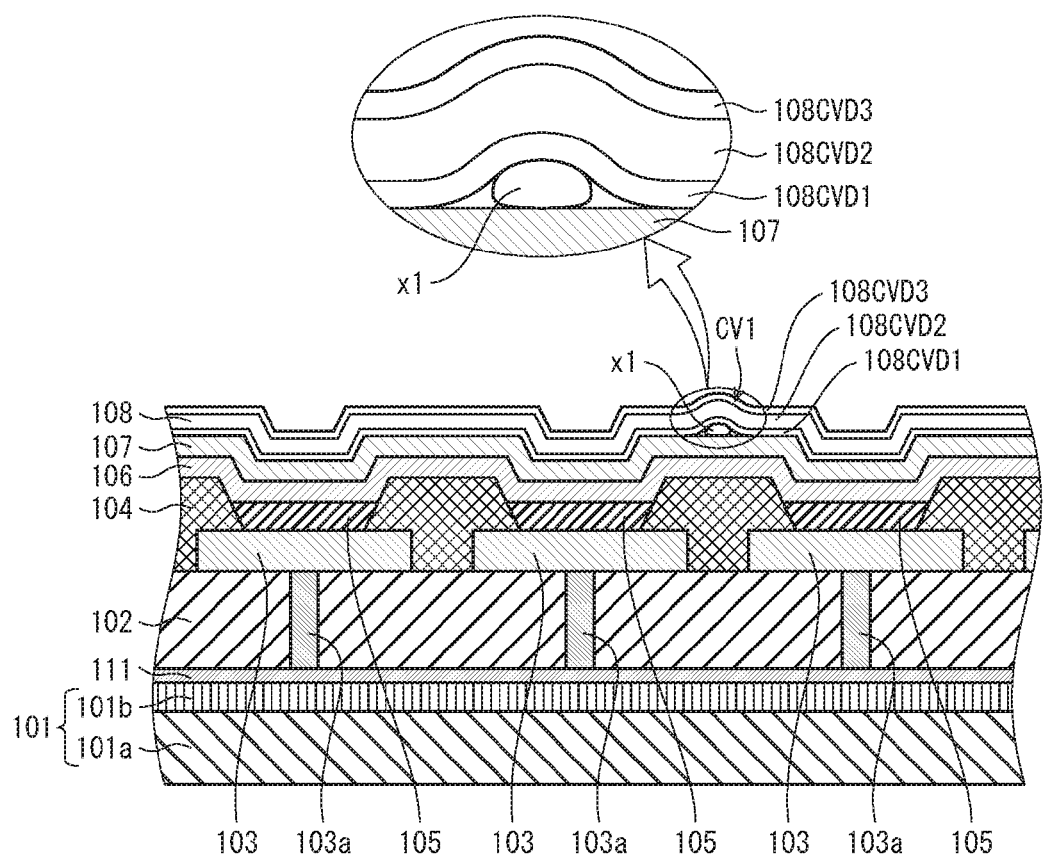
FIG. 3 is a cross-sectional view illustrating a sealing layer 108 formed over a foreign particle.

The following describes the covering capability of the sealing layer 108 with its above-described triple-layer structure. FIG. 3 is a cross-sectional view illustrating the sealing layer 108 with a foreign particle (indicated by x1) therebeneath. Since the sealing layer 108 has been formed over the foreign particle x1 existing on the counter electrode 107, the silicon nitride film 108CVD2 of the sealing layer 108 has a bend CV1. Here, because the silicon nitride film 108CVD2 has high ammonia content and thus has high deformability, the bend CV1 is not abrupt and rather is gradual. Because the change in shape of the silicon nitride film 108CVD2 is not abrupt and rather is gradual, the bending of each of the silicon nitride film 108CVD1 and the silicon nitride film 108CVD3, which are in contact with the silicon nitride film 108CVD2, is also not abrupt. Thus, while the sealing layer 108 is formed over the foreign particle x1, no crack is formed in the sealing layer 108, and thus, the sealing layer 108 has high covering capability. Meanwhile, the ammonia desorption amount from the silicon nitride film 108CVD2 within the temperature range from 50 degrees Celsius to 80 degrees Celsius is high. Thus, without the silicon nitride film 108CVD1, which is located between the silicon nitride film 108CVD2 and the counter electrode 107, the ammonia that desorbs from the silicon nitride film 108CVD2 under room temperature may affect the organic EL display elements located below the sealing layer 108. However, the silicon nitride film 108CVD1 blocks the diffusion of the ammonia desorbing from the silicon nitride film 108CVD2 to the organic EL display elements. Accordingly, the organic EL display elements formed by the layers below the sealing layer 108, including the counter electrode 107, are prevented from being affected by the ammonia desorbing from the silicon nitride film 108CVD2. In this sense as well, the sealing layer 108 achieves high sealing capability. This concludes description of the structure of the sealing layer 108 and the protection achieved by the sealing layer 108 due to having such a structure.

[Manufacturing Method of Organic EL Display Panel 1]

Figure 4:
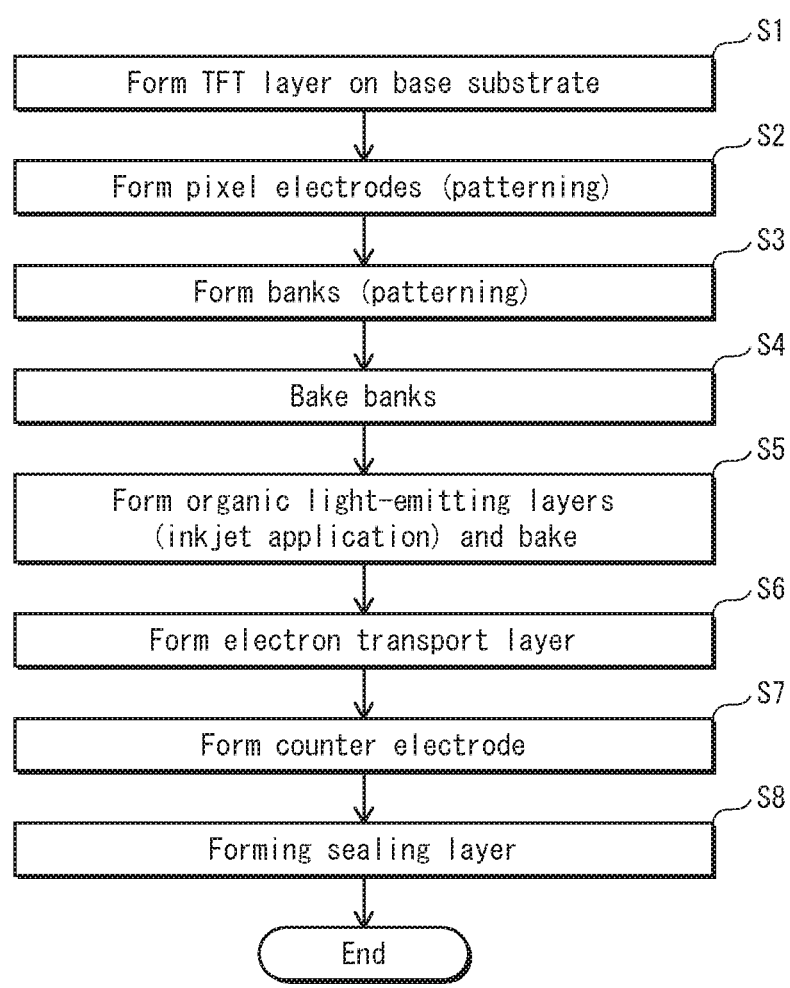
FIG. 4 is a schematic illustrating processes for manufacturing the organic EL display panel.

The following describes a manufacturing method of the organic EL display panel 1, with reference to FIG. 4. FIG. 4 is a schematic illustrating processes for manufacturing the organic EL display panel 1.

First, the TFT layer 101b is formed on the base substrate 101a (Step S1). Then, the pixel electrodes 103, each of which is made of a metal material with a thickness of around 400 nm, are formed through sputtering or vacuum vapor deposition, one for each sub-pixel (Step S2).

Subsequently, the banks 104 are formed by performing patterning through photolithography, and then the banks 104 are baked (Step S4). Following this baking, the organic light-emitting layers 105 are formed by applying organic material to each of a plurality of concave spaces formed by the banks 104 intersecting with one another through inkjet application, and then the organic light-emitting layers 105 are baked (Step S5). Then, the electron transport layer 106 is formed on the banks 104 (Step S6).

Subsequently, the counter electrode 107 is formed by forming a film of a material such as ITO or IZO through sputtering or the like (Step S7). Then, the sealing layer 108 is formed by depositing a light-transmissive material such as SiN or SiON on the surface of the counter electrode 107 through sputtering or CVD (Step S8). The following describes the depositing of the sealing layer 108 in detail. First, a plasma CVD device 200 used for depositing the sealing layer 108 is described.

[Plasma CVD Device 200]

Figures 5A, 5B:
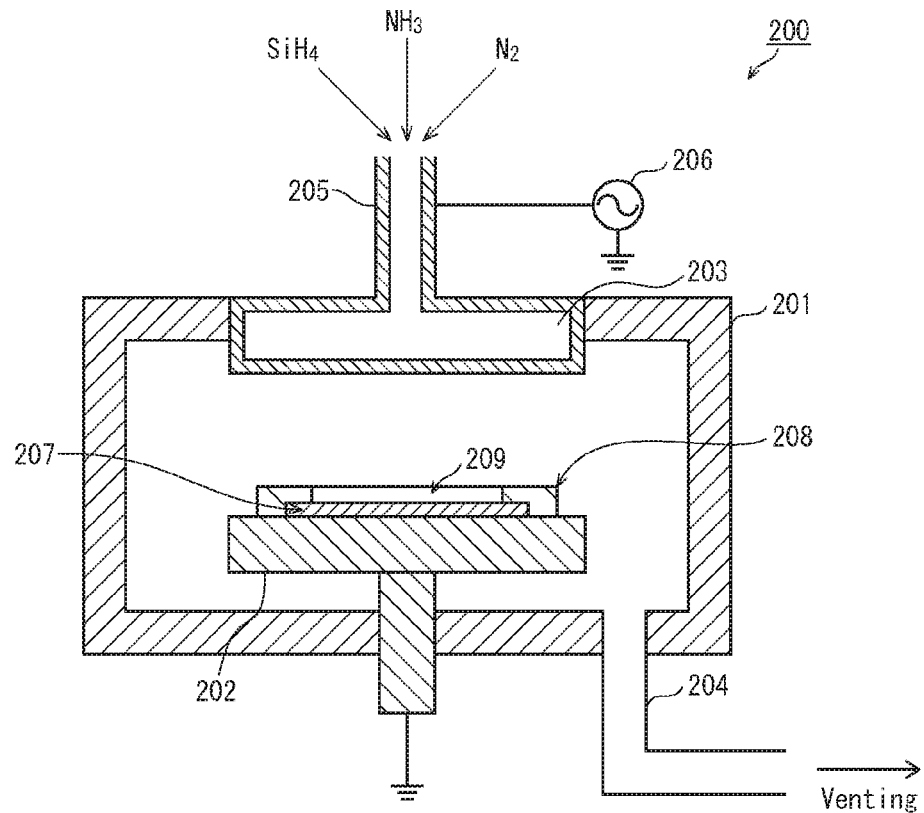
FIG. 5A illustrates the overall structure of a plasma CVD device 200.
FIG. 5B illustrates film-forming conditions of the silicon nitride film 108CVD1 (silicon nitride film 108CVD3).

FIG. 5A is a schematic illustrating the structure of the plasma CVD device 200. As illustrated in FIG. 5A, the plasma CVD device 200 includes a reaction chamber 201, a substrate holder 202, a showerhead 203, a discharge outlet 204, a gas inlet 205, and a high-frequency power supply 206.

The reaction chamber 201 is a box that encloses a reaction space where plasma reaction takes place.

On the substrate holder 202 is placed the organic EL display panel 1 still in a state where sealing of the organic EL display elements has not yet been performed. The organic EL display panel 1 in this state is referred to in the following as a "pre-sealing EL substrate 207". The substrate holder 202 includes a heater for heating the pre-sealing EL substrate 207. Further, the substrate holder 202 serves as the first of a pair of plasma discharge electrodes and is connected to the ground.

The showerhead 203 faces the substrate holder 202, and has small holes for discharging reaction gases introduced via the gas inlet 205. Note that the showerhead 203 and the gas inlet 205 are electrically insulated from the reaction chamber 201 and are connected to the high-frequency power supply 206, to serve as the second of the pair of plasma discharge electrodes.

The discharge outlet 204 enables venting of the reaction chamber 201, whereby the pressure inside the reaction chamber 201 can be maintained at a predetermined level.

The gas inlet 205 is provided for the introduction of the reaction gases and a cleaning gas.

The high-frequency power supply 206 generates microwaves for plasma discharge.

This concludes the description of the plasma CVD device 200. The following describes the pre-sealing EL substrate 207, with respect to which deposition is performed. The pre-sealing EL substrate 207 is the state of the organic EL display panel 1 before forming of the sealing layer 108 illustrated in FIG. 1, and already has a display region 41 formed at the center thereof. The pre-sealing EL substrate 207, with a mask 208 attached thereto, is placed on the substrate holder 202.

The mask 208 is made of a ceramic, and has a rectangular frame-like shape with an opening 209 at the center thereof. The outer circumferential portion of the mask 208, which surrounds the opening 209, has greater size than the pre-sealing EL substrate 207. The opening 209 defines the region of the pre-sealing EL substrate 207 on which the sealing layer 108 is to be deposited. This concludes the description of the plasma CVD device 200.

With the plasma CVD device 200, (i) the CVD for forming the silicon nitride film 108CVD1 (silicon nitride film 108CVD3) and (ii) the CVD for forming the silicon nitride film 108CVD2 are performed under different conditions, as illustrated in FIG. 5B.

Specifically, FIG. 5B illustrates that the following conditions are applied in the CVD for forming the silicon nitride film 108CVD1 (silicon nitride film 108CVD3). In the CVD for forming the silicon nitride film 108CVD1 (silicon nitride film 108CVD3): silane gas flow amount from the showerhead 203 is set to 100 sccm (standard cubic centimeters per minute); ammonia gas flow amount from the showerhead 203 is set to 70 sccm; and nitrogen gas flow amount from the showerhead 203 is set to 3000 sccm. Further, pressure inside the reaction chamber 201 is set to 100 Pa, and film thickness is set to 0.2 μm.

Meanwhile, FIG. 5B illustrates that the following conditions are applied in the CVD for forming the silicon nitride film 108CVD2.

Specifically, pressure inside the reaction chamber 201 is set to a pressure greater than twice but smaller than five times the same in the CVD for forming the silicon nitride film 108CVD1 (silicon nitride film 108CVD3). For example, it is preferable to set the pressure inside the reaction chamber 201 to be approximately three times the same in the CVD for forming the silicon nitride film 108CVD1 (silicon nitride film 108CVD3).

Further, silane gas flow amount from the showerhead 203 is set to be greater than twice but smaller than six times the same in the CVD for forming the silicon nitride film 108CVD1 (silicon nitride film 108CVD3). For example, it is preferable to set the silane gas flow amount from the showerhead 203 to be approximately four times the same set in the CVD for forming the silicon nitride film 108CVD1 (silicon nitride film 108CVD3).

Further, ammonia gas flow amount from the showerhead 203 is set to be greater than four times but smaller than twenty times the same in the CVD for forming the silicon nitride film 108CVD1 (silicon nitride film 108CVD3). For example, it is preferable to set the ammonia gas flow amount from the showerhead 203 to be approximately twelve times the same set in the CVD for forming the silicon nitride film 108CVD1 (silicon nitride film 108CVD3).

Further, nitrogen gas flow amount from the showerhead 203 is set to be similar to the same in the CVD for forming the silicon nitride film 108CVD1 (silicon nitride film 108CVD3).

Finally, the film thickness is set to 2 μm-10 μm.

Here, the thickness of the silicon nitride film 108CVD2 is at least three times the thickness of the silicon nitride film 108CVD1 (silicon nitride film 108CVD3) and at most fifty times the thickness of the silicon nitride film 108CVD1 (silicon nitride film 108CVD3). Based on this, because the silicon nitride film 108CVD2 covers the same surface area as the silicon nitride film 108CVD1 (silicon nitride film 108CVD3), the volume of the silicon nitride film 108CVD2 is at least three times the volume of the silicon nitride film 108CVD1 (silicon nitride film 108CVD3) and at most fifty times the volume of the silicon nitride film 108CVD1 (silicon nitride film 108CVD3). Further, based on the results of the TDS analysis shown in FIGS. 2A and 2B, an assumption can be made that the ammonia content in the silicon nitride film 108CVD2 is at least one thousand times the ammonia content in the silicon nitride film 108CVD1 (silicon nitride film 108CVD3). Thus, the silicon nitride film 108CVD2 has greater ammonia content per unit volume than the silicon nitride film 108CVD1 (silicon nitride film 108CVD3).

[Process of Depositing Sealing Layer 108]

Figure 6:
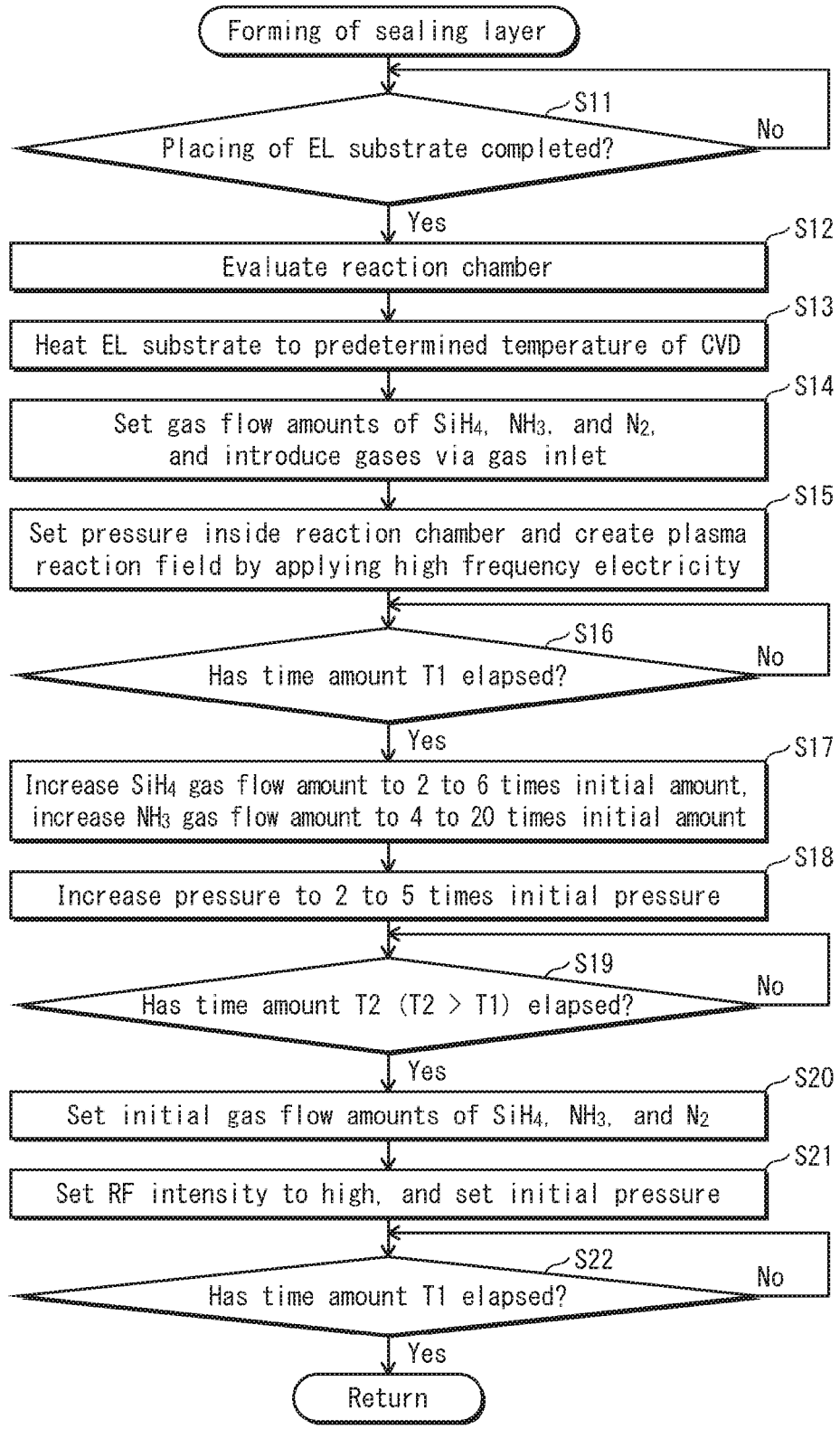
FIG. 6 is a flowchart illustrating a process of depositing a sealing layer 108 in detail.

The following describes the CVD performed by using the plasma CVD device 200. FIG. 6 is a flowchart illustrating the process of forming the sealing layer 108 in detail.

First, a judgment is made of whether the pre-sealing EL substrate 207 has been placed on the substrate holder 202 (Step S11). When the pre-sealing EL substrate 207 has been placed on the substrate holder 202 (YES in Step S11), evacuating of the reaction chamber 201 is performed (Step S12), and then the pre-sealing EL substrate 207 is heated to a predetermined temperature (60 degrees Celsius) for CVD (Step S13). Subsequently, the flow amount of each of the silane gas, ammonia gas, and the nitrogen gas is set to a predetermined flow amount (Step S14). Initially, silane gas flow amount is set to 100 sccm, ammonia gas flow amount is set to 70 sccm, and nitrogen gas flow amount is set to 3000 sccm.

In this state, the pressure inside the reaction chamber 201 is set to 100 Pa, and a plasma reaction field is created near the surface of the pre-sealing EL substrate 207 (Step S15). Depositing of the silicon nitride film 108CVD1 is started with such conditions set. Then, the plasma CVD device 200 waits until a time amount T1 elapses (NO in Step S16). Note that the time amount T1 is the amount of time necessary to provide the silicon nitride film 108CVD1 with the above-described thickness of 0.2 μm.

When the time amount T1 elapses (YES in Step S16), the film-forming conditions are changed. Specifically, silane gas flow amount is set to a flow amount that is greater than twice and smaller than six times the initial flow amount, ammonia gas flow amount is set to a flow amount that is greater than four times and smaller than twenty times the initial flow amount, and nitrogen gas flow amount is set to a flow amount substantially similar to the initial flow amount (Step S17). Further, RF intensity is set to a smaller intensity than the previous intensity, and the pressure inside the reaction chamber 201 is set to a pressure than is greater than twice and smaller than five times the initial pressure (Step S18). Then, the plasma CVD device 200 waits until a time amount T2 elapses (NO in Step S19). Note that the time amount T2 is the amount of time necessary to provide the silicon nitride film 108CVD2 with the above-described thickness of 2 μm-10 μm.

When the time amount T2 elapses (YES in Step S19), the initial film-forming conditions are set once again. That is, each of silane gas flow amount, ammonia gas flow amount, and nitrogen gas flow amount is set to the initial gas flow amount having been set in Step S14, and the pressure inside the reaction chamber 201 is also set to the initial pressure (Step S21). Specifically, silane gas flow amount is set to 100 sccm once again, ammonia gas flow amount is set to 70 sccm once again, and nitrogen gas flow amount is set to 3000 sccm once again. Further, the pressure inside the reaction chamber 201 is set to 100 Pa once again. Then, the plasma CVD device 200 waits until the time amount T1 elapses (NO in Step S22). The plasma CVD device 200 terminates the processing in the flowchart of FIG. 6 when the time amount T1 elapses (YES in Step S22).

Figure 7A:
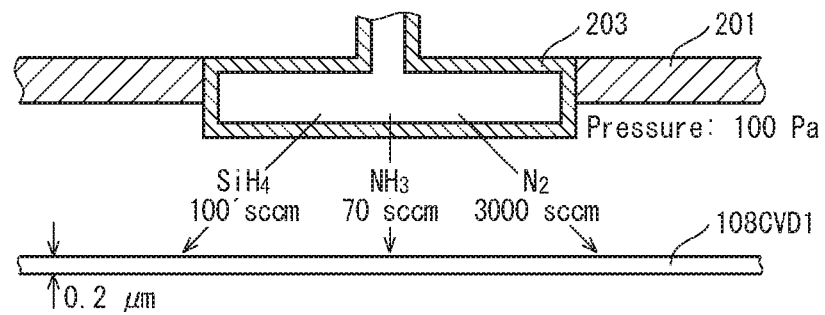
FIGS. 7A through 7C are schematics illustrating how the sealing layer 108 is formed through the depositing process.
Figure 7B:
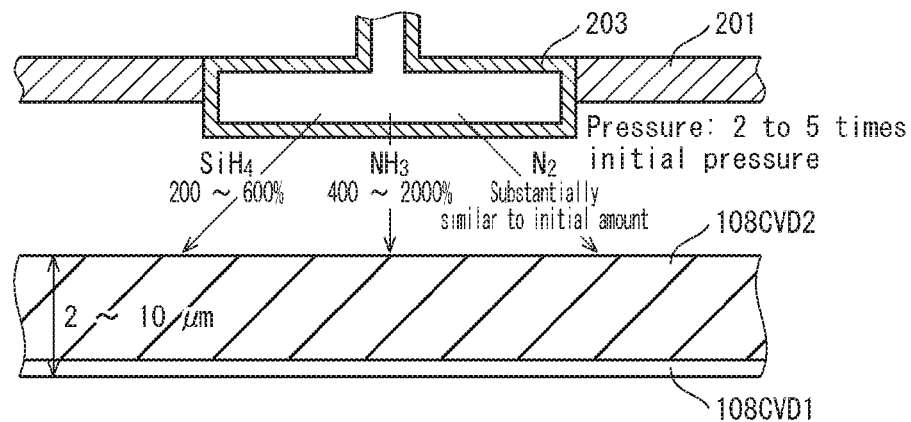
Figure 7C:
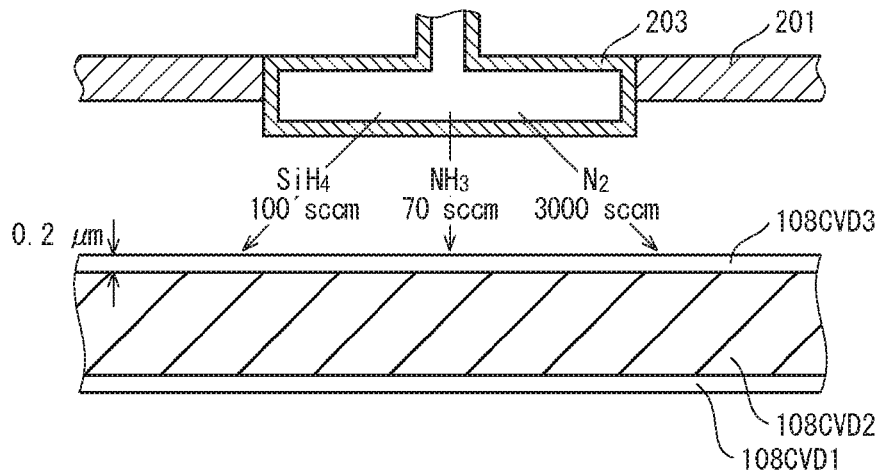

FIGS. 7A through 7C are schematics illustrating how the sealing layer 108 is formed through the depositing process described above. Performing the depositing of the silicon nitride film 108CVD1 under the above-described film-forming conditions over the time amount T1 (Steps S14 through S16) results in the silicon nitride film 108CVD1, having a thickness of 0.2 μm, being formed on the counter electrode 107 as illustrated in FIG. 7A. After the silicon nitride film 108CVD1 has been formed, performing the depositing of the silicon nitride film 108CVD2 under the above-described film-forming conditions over the time amount T2 (Steps S17 through S19) results in the silicon nitride film 108CVD2, having a thickness of 2 μm-10 μm, being formed on the silicon nitride film 108CVD1 as illustrated in FIG. 7B. After the silicon nitride film 108CVD2 has been formed, performing the depositing of the silicon nitride film 108CVD3 under the above-described film-forming conditions over the time amount T1 (Steps S20 through S22) results in the silicon nitride film 108CVD3, having a thickness of 0.2 μm, being formed on the silicon nitride film 108CVD2 as illustrated in FIG. 7C.

[Assessment of Sealing Capability]

Figures 8A, 8B:
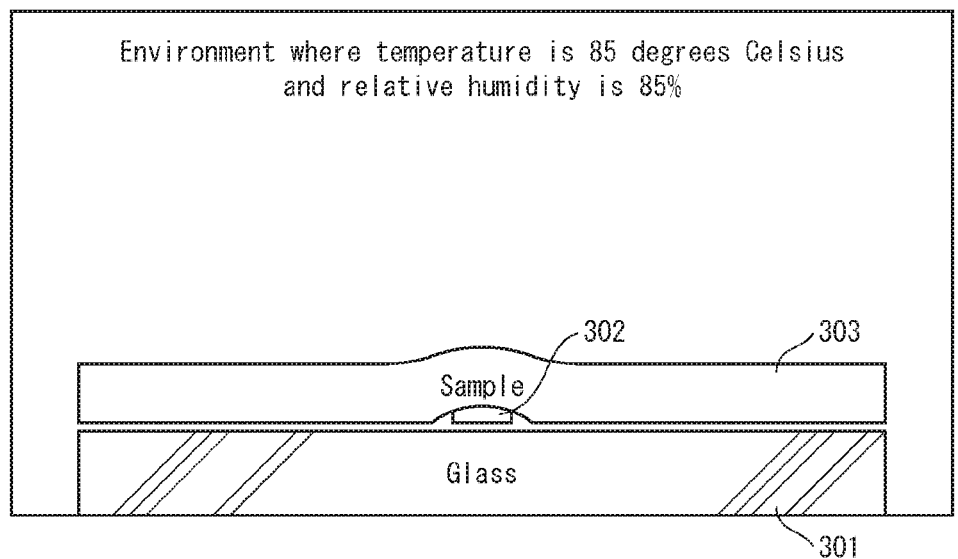
FIG. 8A illustrates a test environment for a durability assessment test.
FIG. 8B illustrates the results of the durability assessment test.

The inventor conducted a durability assessment test by preparing a sample silicon nitride film having a triple-layer structure similar to that of the sealing layer 108 (i.e., a sample silicon nitride film composed of the silicon nitride film 108CVD1, the silicon nitride film 108CVD2, and the silicon nitride film 108CVD3). The durability assessment test was conducted to assess the sealing capability of the sealing layer 108. FIG. 8A illustrates the test environment for the durability assessment test, and FIG. 8B illustrates the results of the durability assessment test. As illustrated in FIG. 8A, the test was performed by placing a film piece 302 on a glass substrate 301, disposing a sample sealing film 303 over the film piece 302, placing the sample 303 in a room where temperature is 85 degrees Celsius and relative humidity is 85%, and observing the durability of the sample 303. Because the sample sealing film 303 is disposed over the film piece 302, the sample sealing film 303 would come apart from the glass substrate 301 should a small crack be formed therein and should moisture intrude into the sample sealing film 303 from the crack. Thus, the amount of time until the sample sealing film 303 comes apart from the glass substrate 301 in such a manner was measured as an indicator of durability of the sample sealing film 303. First, the inventor disposed the above-described sample silicon nitride film having the triple-layer structure (the sample silicon nitride film composed of the silicon nitride film 108CVD1, the silicon nitride film 108CVD2, and the silicon nitride film 108CVD3) over the film piece 302 and exposed the sample to the environment where temperature is 85 degrees Celsius and relative humidity is 85% in order to assess durability.

Also, for comparison, the inventor also disposed a sample sealing film having a single-layer structure over the film piece 302 and exposed the sample to the environment where temperature is 85 degrees Celsius and relative humidity is 85% in order to assess durability. Note that this sample sealing film was formed with the film-forming conditions used for forming the silicon nitride film 108CVD1 (silicon nitride film 108CVD3).

It turned out that the single-layer sealing film came apart from the glass substrate 301 due to intrusion of moisture, at the point when 24 hours elapsed from the start of the test. Meanwhile, the triple-layer sealing film composed of the silicon nitride film 108CVD1, the silicon nitride film 108CVD2, and the silicon nitride film 108CVD3 endured the environment where temperature is 85 degrees Celsius and relative humidity is 85% without coming apart from the glass substrate 301 for over 200 hours. Through the test, it was revealed that the triple-layer sealing film composed of the silicon nitride film 108CVD1, the silicon nitride film 108CVD2, and the silicon nitride film 108CVD3 is capable of withstanding the test environment where temperature is 85 degrees Celsius and relative humidity is 85% for over 200 hours, without any crack being formed therein.

CONCLUSION

As described up to this point, in the organic EL display panel 1, the sealing layer 108, which has a multi-layer structure enabling the sealing layer 108 to cover level differences and foreign particles of various shapes, is provided to seal the plurality of organic EL display elements, and even if the organic EL display panel 1 is placed in a harsh environment with high temperature and high humidity, the organic EL display panel 1 maintains its sealing performance. Thus, the organic EL display panel 1 pertaining to the embodiment maintains its durability even under harsh conditions.

<Modifications>

Description is provided of the organic EL display panel 1 pertaining to the embodiment up to this point. However, the present disclosure is not limited to the organic EL display panel 1 having the structure described in the embodiment, and modifications such as those described in the following can be made.

(1) In the embodiment, the sealing layer 108 covers both the display region 41, which is the region within which the organic EL display elements are arranged, and a region 42 surrounding the display region 41. However, the sealing layer 108 may cover only one of the display region 41 and the surrounding region 42. Further, the sealing layer 108 may cover only a part of the display region 41 and/or the surrounding region 42.

(2) In the embodiment, each of the organic EL display elements has a separate organic light-emitting layer 105. However, multiple organic EL display elements may share a single organic light-emitting layer. Further, the layer that is shared by multiple organic EL display elements may be a hole injection layer, a hole transport layer, an electron injection layer, and/or an electron transport layer.

Further, the organic EL display elements may share a white light-emitting layer, which is a combination of light-emitting layers for the three primary colors R, G, and B.

(3) In the embodiment, pixel electrodes serving as anodes are disposed closer to the substrate in which TFTs are formed, as compared to the counter electrode serving as a cathode. However, a structure in which a cathode is disposed closer to the substrate in which TFTs are formed, as compared to an anode, may be similarly implemented.

<<Supplement>>

The embodiment described above is a mere preferable example of how the technology pertaining to the present disclosure may be specifically implemented. As such, values, shapes, materials, components, arrangement positions of components, connections between components, processes, and the order in which processes are carried out described above are mere examples, and shall not be construed as limiting the technology pertaining to the present disclosure. Further, among the components described in the embodiment, those that are not recited in the independent claims, which describe the technology pertaining to the present disclosure using the broadest of concepts, shall be construed as being components that may be and may not be included, and when included, constitutes a more preferable forms of implementation of the technology pertaining to the present disclosure.

In addition, the drawings referred to in the embodiment may illustrate components at sizes differing from their actual sizes, in order to facilitate understanding of the technology pertaining to the present disclosure. Further, the technology pertaining to the present disclosure shall not be construed as being limited to what is disclosed in the embodiment, and instead, shall be construed as including various modifications that do not depart from the spirit and scope thereof.

Further, an organic EL display panel typically includes members such as circuit components and lead wires disposed on and above a substrate. However, the description provided up to this point does not include description of such electrical wiring and electrical circuits for not being directly necessary in describing the technology pertaining to the present disclosure, and electrical wiring and electrical circuits may be implemented in various forms based on common knowledge in the technical field. In addition, the drawings referred to in the above are schematics, and as such, do not necessarily provide precise illustration.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. An organic EL display panel comprising:
   a substrate;
   display elements over the substrate;
   a first sealing layer over the display elements;
   a buffer layer covering the first sealing layer; and
   a second sealing layer covering the buffer layer, wherein
   the first sealing layer, the buffer layer, and the second sealing layer are each made of a silicon nitride film, and
   a peak amount of ammonia gas desorbing from the silicon nitride film of the buffer layer within a predetermined temperature range is greater than one hundred times and smaller than one thousand times a peak amount of ammonia gas desorbing from each of the silicon nitride film of the first sealing layer and the silicon nitride film of the second sealing layer within the predetermined temperature range.

2. The organic EL display panel of claim 1, wherein the buffer layer has a thickness that is at least three times and at most fifty times a thickness of each of the first sealing layer and the second sealing layer.

3. The organic EL display panel of claim 1, wherein the thickness of the buffer layer is at least 2 μm and at most 10 μm.

4. A method of manufacturing an organic EL display panel, the method comprising:
   forming display elements on a substrate;
   sealing the display elements with a first sealing layer;
   covering the first sealing layer with a buffer layer; and
   covering the buffer layer with a second sealing layer, wherein
   the first sealing layer, the buffer layer, and the second sealing layer are each made of a silicon nitride film,
   forming of the silicon nitride film of the first sealing layer, the silicon nitride film of the buffer layer, and the silicon nitride film of the second sealing layer is performed through chemical vapor deposition using ammonia gas as a source material, and
   an ammonia gas flow amount set in forming the silicon nitride film of the buffer layer is greater than four times and smaller than twenty times an ammonia gas flow amount set in forming each of the silicon nitride film of the first sealing layer and the silicon nitride film of the second sealing layer.

5. The method of claim 4, wherein
   in the chemical vapor deposition, silane gas is additionally used as the source material, and
   a silane gas flow amount set in forming the silicon nitride film of the buffer layer is greater than twice and smaller than six times a silane gas flow amount set in forming each of the silicon nitride film of the first sealing layer and the silicon nitride film of the second sealing layer.

6. The method of claim 4, wherein
   a pressure set in forming the silicon nitride film of the buffer layer for causing ammonia gas, silane gas, and nitrogen gas to react is greater than twice and smaller than five times a pressure set in forming each of the silicon nitride film of the first sealing layer and the silicon nitride film of the second sealing layer for causing ammonia gas, silane gas, and nitrogen gas to react.

* * * * *